(12) United States Patent
Iwasaki et al.

(10) Patent No.: US 7,893,793 B2
(45) Date of Patent: Feb. 22, 2011

(54) FILM BULK ACOUSTIC WAVE RESONATOR AND METHOD FOR MANUFACTURING THE SAME

(75) Inventors: Tomohiro Iwasaki, Osaka (JP); Keiji Onishi, Osaka (JP); Hiroshi Nakatsuka, Osaka (JP); Takehiko Yamakawa, Osaka (JP); Tomohide Kamiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 698 days.

(21) Appl. No.: 11/844,809

(22) Filed: Aug. 24, 2007

(65) Prior Publication Data

US 2008/0051039 A1 Feb. 28, 2008

(30) Foreign Application Priority Data

Aug. 25, 2006 (JP) .............................. 2006-229316

(51) Int. Cl.
*H03H 9/15* (2006.01)
*H03H 9/54* (2006.01)
*H03H 9/70* (2006.01)

(52) U.S. Cl. ...................... 333/133; 333/187; 333/189; 310/312

(58) Field of Classification Search ......... 333/187–189, 333/133; 310/312, 324, 335
See application file for complete search history.

(56) References Cited

U.S. PATENT DOCUMENTS 3,585,418 A * 6/1971 Koneval ..................... 310/326

| | | | |
|---|---|---|---|
| 6,788,170 B1 * | 9/2004 | Kaitila et al. ............... | 333/187 |
| 2002/0014808 A1 | 2/2002 | Misu et al. | |
| 2002/0030424 A1 * | 3/2002 | Iwata ......................... | 310/363 |
| 2007/0210877 A1 * | 9/2007 | Osugi et al. ................. | 333/187 |
| 2008/0179995 A1 * | 7/2008 | Umeda et al. ............... | 310/324 |

FOREIGN PATENT DOCUMENTS

| JP | 2003/505906 | 2/2003 |
|---|---|---|
| WO | WO 99/37023 | 7/1999 |
| WO | WO 01/06647 | 1/2001 |

* cited by examiner

*Primary Examiner*—Barbara Summons
(74) *Attorney, Agent, or Firm*—Hamre, Schumann, Mueller & Larson, P.C.

(57) ABSTRACT

A film bulk acoustic wave resonator including a piezoelectric body 1, and a first electrode 2 and a second electrode 3 that are provided respectively on the main surfaces of the piezoelectric body, the piezoelectric body being applied an electric field through the first and the second electrodes so as to generate a resonant vibration. A first mass load material portion 4 having an annular shape is provided outside the planar region of the first electrode on the main surface of the piezoelectric body, a mass load effect thereof being larger than that of the first electrode. The outer periphery of the first electrode and the inner periphery of the first mass load material portion are spaced apart from each other, whereby the first electrode and the first mass load material portion are electrically insulated from each other. The first mass load material portion has a laminated structure including a first auxiliary electrode layer 2a and a load material layer 4a formed on the auxiliary electrode layer. The first auxiliary electrode is formed with the same material to have the same thickness as the first electrode. Energy loss can be reduced, while the first mass load material portion can be formed easily with high precision.

22 Claims, 16 Drawing Sheets

FILM BULK ACOUSTIC WAVE RESONATOR AND METHOD FOR MANUFACTURING THE SAME

BACKGROUND OF THE INVENTION

1. Field of the Invention

The present invention relates to a film bulk acoustic wave resonator configured to trap the energy of an acoustic wave in a resonance portion.

2. Description of Related Art

The components incorporated in electronic devices such as portable devices are demanded to be smaller and lighter. For example, filters used in portable devices are demanded to be smaller and to be capable of precise adjustment of frequency characteristics. As a filter that satisfies these demands, a filter having a film bulk acoustic wave resonator is known.

A conventional film bulk acoustic wave resonator will be described below with reference to FIGS. 13, 14, 15A and 15B. FIG. 13 is a cross sectional view showing the basic structure of a conventional film bulk acoustic wave resonator 50. The film bulk acoustic wave resonator 50 has a resonance portion in which a piezoelectric body 51 is sandwiched between a lower electrode portion 52 and an upper electrode portion 53. This resonance portion is placed on a semiconductor substrate 55 in which a cavity 54 is formed. The cavity 54 can be formed by, for example, partially etching from the back surface of the semiconductor substrate 55 using a micromachining method.

As shown in FIG. 14, by applying an electric field in the thickness direction to the piezoelectric body 51 with the lower electrode portion 52 and the upper electrode portion 53, this film bulk acoustic wave resonator 50 produces vibrations in the thickness direction. The operation of this film bulk acoustic wave resonator 50 will be described using a thickness longitudinal vibration of an infinite plate. In the film bulk acoustic wave resonator 50, when an electric field is applied between the lower electrode portion 52 and the upper electrode portion 53, the electric energy is converted to mechanical energy by the piezoelectric body 51. The induced mechanical vibration is an extensional vibration in the thickness direction, and elongates and contracts in the direction of the electric field. Generally, the film bulk acoustic wave resonator 50 utilizes a resonant vibration in the thickness direction of the piezoelectric body 51, and is operated with a resonance frequency such that a half wavelength corresponds to a thickness of the piezoelectric body 51. The cavity 54 shown in FIG. 13 is utilized to ensure the thickness longitudinal vibration of this piezoelectric body 51.

An equivalent circuit of this film bulk acoustic wave resonator 50 has both series resonance and parallel resonance as shown in FIG. 15A. In other words, the equivalent circuit of this film bulk acoustic wave resonator 50 is composed of a series resonance portion including a capacitor C1, an inductor L1 and a resistance R1, and a capacitor C0 connected in series to the series resonance portion. With this circuit configuration, the admittance frequency characteristics of the equivalent circuit as shown in FIG. 15B are obtained: the admittance becomes the greatest at the resonance frequency fr, and becomes the smallest at the antiresonance frequency fa. The resonance frequency fr and the antiresonance frequency fa satisfy the following relationship.

$$fr = 1/\{2\pi\sqrt{(L1 \times C1)}\}$$

$$fa = fr\sqrt{(1 + C1/C0)}$$

When the film bulk acoustic wave resonator 50 having these admittance frequency characteristics is used as a filter, a small low-loss filter can be realized, because the resonant vibration of the piezoelectric body 51 is obtained. As shown in FIG. 16A, by connecting two film bulk acoustic wave resonators 50 in series and parallel, a band-pass filter having characteristics as shown in FIG. 16B can be formed easily.

Actually, the film bulk acoustic wave resonator is necessarily fixed to a substrate, and the size of electrodes in the radial direction is finite. Therefore not all the thickness longitudinal vibration generated by the vibration portion is excited as the main resonant vibration, but a part of the vibration leaks into the substrate or the piezoelectric body disposed outside the resonator. Because of this vibration leakage (unwanted vibration) to the substrate or in the radial direction, a part of the energy intended to be used to excite vibrations inside the piezoelectric body should be treated as a loss. To address this, inventions to reduce the energy loss are disclosed in WO 99/37023, JP 2003-505906 A and the like.

The conventional method of reducing an energy loss disclosed in JP 2003-505906 A will be described with reference to FIGS. 17A to 17C. This method employs an energy trapping structure, which is one of usual methods of reducing an energy loss. FIG. 17A is a plan view of a film bulk acoustic wave resonator. FIG. 17B is a side view showing a cross section viewed from the front of FIG. 17A. FIG. 17C is a cross sectional view taken from a side of FIG. 17A. Note that FIG. 17A does not show a substrate 60, which is shown in other diagrams.

A resonator structure is formed on the substrate 60 via an etch pit 61 and a film layer 62. The etch pit 61 is provided to insulate the resonator structure from the substrate 60. The resonator structure includes two conductive layers 63 and 64, and a piezoelectric layer 65 interposed therebetween. The conductive layers 63 and 64 as well as the piezoelectric layer 65 extend in a first region capable of piezoelectric excitation, and excitation can be performed in a specific piezoelectric excitation mode.

This resonator structure includes a frame zone 66 surrounding the center region within the first region. The frame zone 66 is formed by increasing part of the thickness of the upper conductive layer 64. The cutoff frequency of the layer structure of the frame zone 66 in a piezoelectric excitation mode differs from the piezoelectric excitation mode of the layer structure of the center region. The width of the frame zone 66 and the acoustic characteristics of the layer structure of the frame zone 66 are configured such that displacement of the maximum resonance mode excited by the piezoelectric body is almost uniform in the center region of the resonator. Thereby, excellent electric characteristics can be realized.

Another example of an energy trapping structure described in WO 99/37023 will be explained with reference to FIGS. 18A to 18D. FIG. 18A is a top view of a resonator. FIG. 18B is a cross sectional view of the resonator. FIG. 18C is an enlarged cross sectional view of an acoustic resonance portion. FIG. 18D shows dispersion curves of the resonator.

A film bulk piezoelectric element 70 (see FIG. 18B) includes a lower electrode 72 formed on one surface of a substrate 71, a piezoelectric thin film 73 formed on the lower electrode 72, and a first upper electrode 74 formed on the piezoelectric thin film 73. Further, a second upper electrode 75 having a mass load larger than that of the first upper electrode 74 is formed outside the first upper electrode 74 on the piezoelectric thin film 73. Reference numeral 76 denotes a cavity, reference numeral 77 denotes a leading wiring, and reference numeral 78 denotes a pad.

As shown in FIG. 18D, the piezoelectric thin film 73 exhibits a high-cut-type dispersion curve. In FIG. 18D, y1 represents the dispersion characteristic of a non-electrode portion piezoelectric body 79c (see FIG. 18C), y2 represents the dispersion characteristic of a first upper electrode portion piezoelectric body 79a that corresponds to the thin first upper electrode 74, and y3 represents the dispersion characteristic of a second upper electrode portion piezoelectric body 79b that corresponds to the thick second upper electrode 75. The cutoff frequency of the second upper electrode portion piezoelectric body 79b having a larger mass load can be lower than the cutoff frequency of the first upper electrode portion piezoelectric body 79a, and thus the energy of acoustic waves can be trapped in the region on the first upper electrode portion 79a side. Accordingly, vibration leakage can be reduced, and excellent performance can be realized.

According to the above-described inventions disclosed in JP No. 2003-505906A and International Publication WO 99/37023, the mass load electrode or the frame zone is disposed within the outline of the surface of the cavity in contact with the resonator, whereby the vibration is trapped in the center region before the vibration reaches the substrate to suppress the vibration leakage (unwanted vibration) from the vibration portion to the substrate. Therefore, excellent resonator characteristics and excellent filter characteristics can be expected.

However, in the above configuration disclosed in JP No. 2003-505906A or International Publication WO 99/37023, as shown in FIG. 19A, the frame zone 66/mass load electrode 75 is electrically connected to the center region. This causes a problem that, even in the frame zone 66/mass load electrode 75, as shown in FIG. 19B, resonance occurs in different resonance modes. In FIG. 19B, A represents the resonance mode of the center region, and B represents the resonance mode of the mass load region (frame zone 66/mass load electrode 75). This causes the electric energy to be dispersed in the center region (resonance mode A) and the mass load region (resonance mode B). As a result, the characteristics of the main resonance mode A are degraded.

In other words, in the case of forming a band-pass filter using a film bulk acoustic wave resonator, as in the above conventional examples, the problem also occurs that attenuation characteristics are degraded outside the pass band as shown in FIG. 19C, because each resonator has a different resonance mode.

WO 99/37023 further describes a film bulk acoustic wave resonator having a structure as shown in FIGS. 20A to 20B. This film bulk acoustic wave resonator basically has the same structure as shown in FIGS. 18A to 18C. The difference is that a dielectric 80 is provided outside a vibration portion made up of a pair of first upper electrodes 74. The dielectric 80 functions similarly to the second upper electrode 75 configured as shown in FIGS. 18A to 18C and acts as a mass load. In addition, the dielectric 80 is electrically insulated from the first upper electrode 74.

However, WO 99/37023 does not clearly disclose the requirements for the dielectric 80 to effectively allow the dielectric 80 to act as a mass load that reduces the vibration leakage by effectively trapping the energy of acoustic waves.

SUMMARY OF THE INVENTION

In view of the above, it is an object of the present invention to provide a film bulk acoustic wave resonator capable of being produced easily with precision so as to have a configuration that is effective for suppressing vibration leakage to a substrate by trapping energy, suppressing generation of different resonance modes, and improving the performance of main resonance mode and out-of-band attenuation characteristics.

A film bulk acoustic wave resonator according to a first configuration of the present invention includes, as the basic configuration, a piezoelectric body made of a piezoelectric thin film; a first electrode provided on one main surface of the piezoelectric body; a second electrode provided on the other main surface of the piezoelectric body; and a first mass load material portion having an annular shape provided outside the planar region of the first electrode on the main surface of the piezoelectric body on which the first electrode is provided, with a mass load effect of the first mass load material portion being larger than that of the first electrode, the piezoelectric body being supplied with an electric field through the first electrode and the second electrode so as to generate a resonant vibration.

In order to solve the above problems, the outer periphery of the planar region of the first electrode and the inner periphery of the annular first mass load material portion are spaced apart from each other, whereby the first electrode and the first mass load material portion are electrically insulated from each other, and the first mass load material portion has a laminated structure including a first auxiliary electrode and a load material layer formed on the first auxiliary electrode, the first auxiliary electrode being formed with the same material to have the same thickness as the first electrode on the piezoelectric body.

A method for manufacturing a film bulk acoustic wave resonator according to a first configuration of the present invention includes: forming a conductive material layer on one main surface of a piezoelectric body made of a piezoelectric thin film; patterning the conductive material layer so as to form a first electrode and a first auxiliary electrode in an annular shape outside the planar region of the first electrode such that the first auxiliary electrode is spaced apart from the outer periphery of the planar region of the first electrode; forming a load material layer on the first auxiliary electrode so as to form a first mass load material portion having a laminated structure; and forming a second electrode on the other main surface of the piezoelectric body.

A film bulk acoustic wave resonator according to a second configuration of the present invention has a basic configuration similar to that of the film bulk acoustic wave resonator according to the first configuration. In order to solve the above problems, a second mass load material portion having an annular shape further is provided so as to face the first mass load material portion outside the planar region of the second electrode on the main surface of the piezoelectric body on which the second electrode is provided. The first electrode and the first mass load material portion are electrically insulated from each other. At least one of the first mass load material portion and the second mass load material portion has a laminated structure including a load material layer having an annular shape provided on the surface of the first electrode or the second electrode and the first electrode or the second electrode positioned at a region facing the load material layer. A mass load effect obtained by summing the first mass load material portion and the second mass load material portion is greater than a mass load effect obtained by summing the first electrode and the second electrode.

A method for manufacturing a film bulk acoustic wave resonator according to a second configuration of the present invention includes: forming a first electrode on one main surface of a piezoelectric body made of a piezoelectric thin film; forming a first mass load material portion having an annular shape, which is electrically insulated from the first electrode, outside the planar region of the first electrode on the main surface of the piezoelectric body on which the first electrode is formed; forming a second electrode on the main surface opposite to the main surface of the piezoelectric body on which the first electrode is formed; and forming a second mass load material portion having an annular shape outside the planar region of the second electrode on the main surface of the piezoelectric body on which the second electrode is formed, such that the second mass load material portion faces the first mass load material portion. At least one of the first mass load material portion and the second mass load material portion has a laminated structure including a load material layer having an annular shape provided on the surface of the first electrode or the second electrode and the first electrode or the second electrode positioned at a region facing the load material layer, and a mass load effect obtained by summing the first mass load material portion and the second mass load material portion is set to be greater than a mass load effect obtained by summing the first electrode and the second electrode.

A method for manufacturing a film bulk acoustic wave resonator according to a third configuration of the present invention includes: forming a first support layer in an annular shape on a first substrate; forming a piezoelectric body on a second substrate; forming a first electrode on the piezoelectric body; forming, on the first electrode, an annular second support layer that extends further inside than the first support layer; transferring the piezoelectric body on which the first electrode and the second support layer are formed from the second substrate onto the first substrate with the first support layer and the second support layer interposed therebetween; forming a second electrode on the main surface opposite to the main surface of the piezoelectric body on which the first electrode is formed; and forming a mass load material portion having an annular shape, which is electrically insulated from the second electrode, outside the planar region of the second electrode on the main surface of the piezoelectric body on which the second electrode is formed. The mass load material portion is disposed such that it faces the inner peripheral region of the second support layer.

According to the film bulk acoustic wave resonator of the present invention as described above, the first mass load material portion has a laminated structure including: the first auxiliary electrode formed with the same material to have the same thickness as the first electrode; and the load material layer. Therefore it is possible to produce, easily and with high accuracy, a configuration effective to trap the energy in the center region and to suppress the generation of different resonance modes in the mass load region.

DETAILED DESCRIPTION OF THE INVENTION

Figure 1:
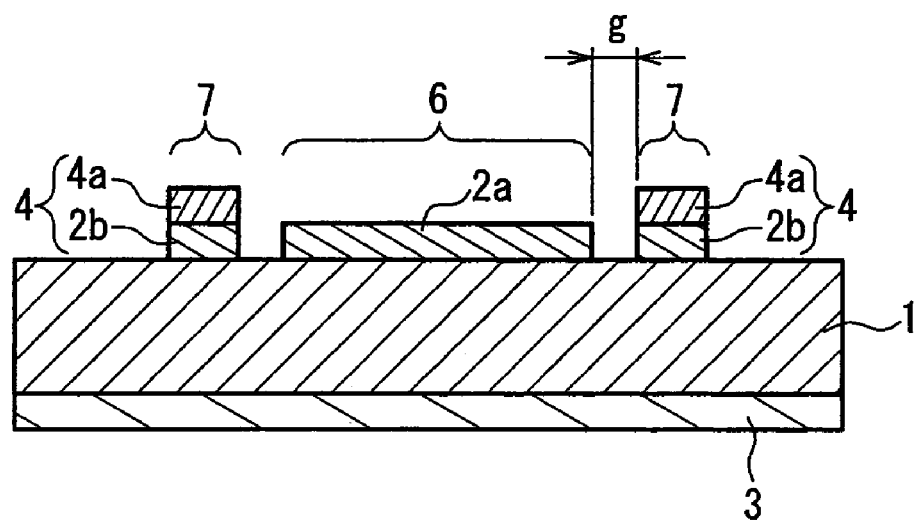
FIG. 1 is a cross sectional view showing a configuration of a resonance portion of a film bulk acoustic wave resonator according to a first embodiment of the present invention.

The film bulk acoustic wave resonator of the present invention can be variously modified as long as it basically has the above configuration.

For example, in the film bulk acoustic wave resonator according to a first configuration of the present invention, it is preferable that the piezoelectric body has high-cut-type dispersion characteristics. The piezoelectric body can be composed mainly of aluminum nitride (AlN).

It is preferable that a distance g between the outer periphery of the planar region of the first electrode and the inner periphery of the first mass load material portion is set to fall within a range defined by the following expression, where dp is the thickness of the piezoelectric body, $\epsilon 33$ is the relative dielectric constant in the thickness direction of the piezoelectric body, and $\epsilon 11$ is the relative dielectric constant in the plane direction of the piezoelectric body.

$$g \geq dp \times \epsilon 11 / \epsilon 33,$$

It is also preferable that a distance g between the outer periphery of the planar region of the first electrode and the inner periphery of the first mass load material portion is less than a single wavelength $\lambda h$ of vibrations in the plane direction in a region within the distance g.

Further, it is possible to employ a configuration in which the film bulk acoustic wave resonator is provided with a substrate that supports a resonance portion configured by the piezoelectric body, the first electrode and the second electrode, and a cavity is formed in the substrate under the resonance portion. In this case, it is preferable that the first mass load material portion is disposed within the outline of the surface of the cavity in contact with the resonator.

Alternatively, it is possible to employ a configuration in which the film bulk acoustic wave resonator is provided with a substrate, and an acoustic mirror is provided on the substrate and configured such that a low acoustic impedance layer and a high acoustic impedance layer are alternately disposed, and a resonance portion configured by the piezoelectric body, the first electrode and the second electrode may be supported on the acoustic mirror.

Further, it is preferable to employ a configuration in which the film bulk acoustic wave resonator is provided with a leading wiring electrode connected to the first electrode, and the leading wiring electrode is electrically insulated from the first mass load material portion.

Further, it is possible to employ a configuration in which the leading wiring electrode is led through a cut-off portion formed in a part of the annular first mass load material portion, and the leading wiring electrode and the first mass load material portion are spaced apart from each other, whereby the leading wiring electrode and the first mass load material portion are electrically insulated from each other.

In the film bulk acoustic wave resonator according to the second configuration, it is preferable that the second electrode and the second mass load material portion are electrically insulated from each other.

Further, it is preferable that the first electrode and the second mass load material portion are disposed such that they do not face each other, and the second electrode and the first mass load material portion are disposed such that they do not face each other.

Hereinafter, embodiments of the present invention will be described with reference to the accompanying drawings.

First Embodiment

Figure 2:
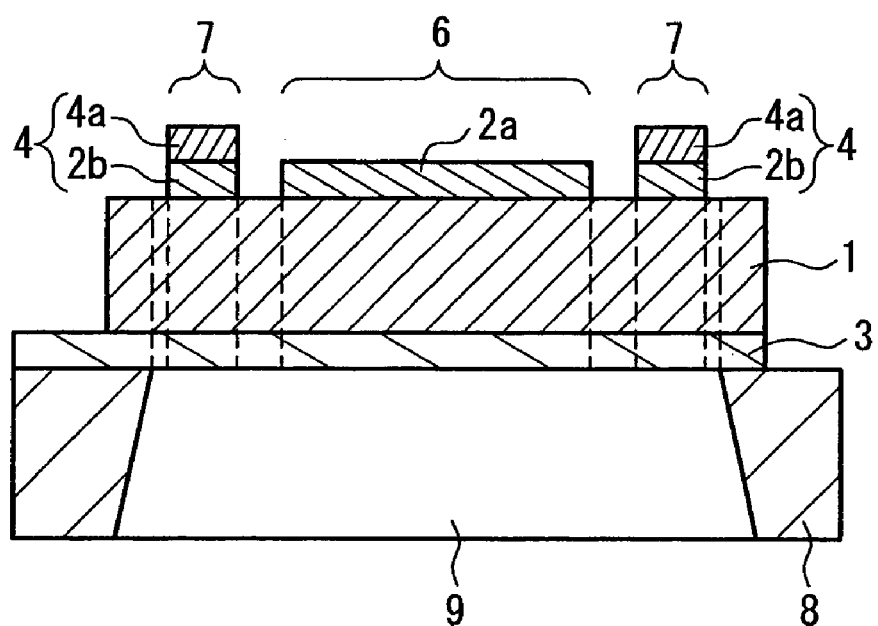
FIG. 2 is a cross sectional view of the film bulk acoustic wave resonator.
Figure 3:
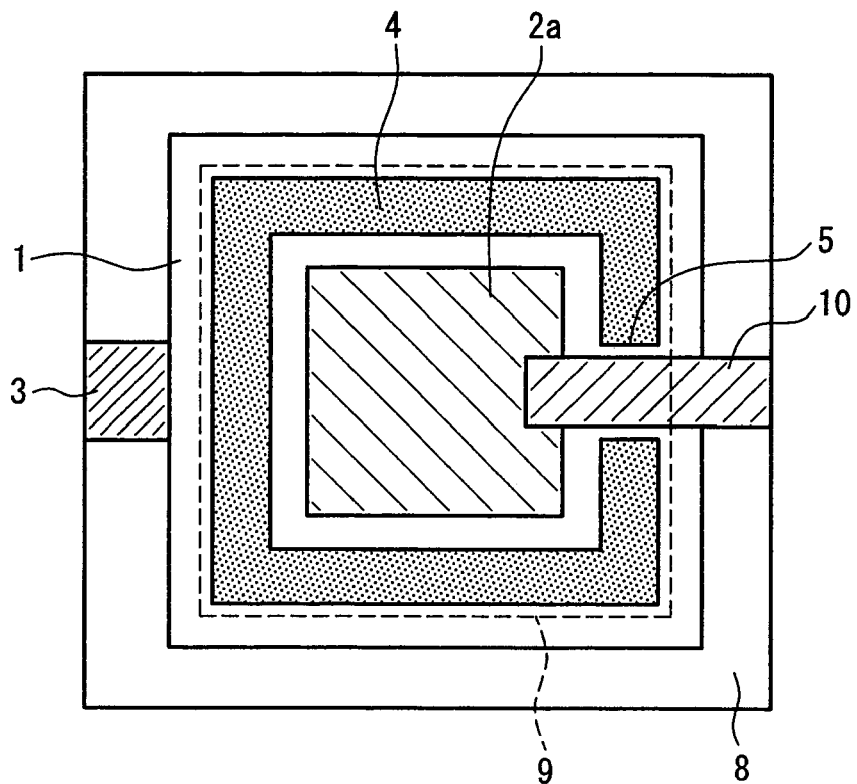
FIG. 3 is a top view of the film bulk acoustic wave resonator including wiring.

FIG. 1 is a cross sectional view showing an example of the structure of the resonance portion of the film bulk acoustic wave resonator according to a first embodiment of the present invention. FIG. 2 is a cross sectional view showing a film bulk acoustic wave resonator including a support structure for the resonance portion shown in FIG. 1. FIG. 3 is a top view showing an example of the structure in which wiring is included in the film bulk acoustic wave resonator of FIG. 2.

The film bulk acoustic wave resonator according to this embodiment has a resonance portion structure as shown in FIG. 1. Specifically, an upper electrode 2a is formed on a piezoelectric body 1, and a lower electrode 3 is formed under the piezoelectric body 1. A first mass load material portion 4 is formed so as to surround the upper electrode 2a on the piezoelectric body 1. The upper electrode 2a, the piezoelectric body 1 and the lower electrode 3 together form a center region 6. The first mass load material portion 4, the piezoelectric body 1 and the lower electrode 3 together form a mass load region 7.

The first mass load material portion 4 may be composed of a two layer film including a first auxiliary electrode 2b and a load material layer 4a. The first auxiliary electrode 2b is formed with the same material and in the same thickness as those of the upper electrode 2a. That is, a conductive material layer (not shown) made of the material of the upper electrode 2a is first formed over the center region 6 and the mass load region 7 on the piezoelectric body 1, and then the conductive material layer is etched to form a gap between the center region 6 and the mass load region 7 so as to divide (patterning) into an upper electrode 2a and a first auxiliary electrode 2b. Then, a load material layer 4a is formed on the first auxiliary electrode 2b.

The resonance portion configured as mentioned above is formed on a substrate 8 as shown in FIG. 2 to produce a film bulk acoustic wave resonator according to this embodiment.

As shown in FIG. 3, the first mass load material portion 4 is formed in an annular shape. The outer periphery of the planar region of the upper electrode 2a and the inner periphery of the planar region of the first mass load material portion 4 are spaced apart from each other, whereby an electrical insulation is provided between the center region 6 and the mass load region 7.

Although shown only in FIG. 3, a leading wiring 10 for the upper electrode 2a is formed on the piezoelectric body 1. In the first mass load material portion 4, a cut-off portion 5 is provided. The leading wiring 10 lies such that the leading wiring 10 extends outward through the cut-off portion 5. Thereby, the leading wiring 10 is spaced apart from the first mass load material portion 4. This prevents the connection between the upper electrode 2a and the first mass load material portion 4 through the leading wiring 10, ensuring electrical insulation between the upper electrode 2a and the first mass load material portion 4. Likewise, the lower electrode 3 is also led out on the substrate 8.

The lower electrode 3 and the upper electrode 2a are formed with, for example, molybdenum (Mo). The piezoelectric body 1 is formed with, for example, a piezoelectric material having high-cut-type dispersion characteristics such as aluminum nitride (AlN).

In order to use a piezoelectric material having high-cut-type dispersion characteristics to form the piezoelectric body 1, and to realize energy trapping, the mass load effect of the mass load region 7 is made larger than that of the center region 6. The mass load effect is determined by "d×ρ", where d is the thickness of each film, and ρ is the density. Accordingly, when the thickness of the lower electrode 3 is uniform throughout the center region 6 and the mass load region 7, the value of "d×ρ" of the first mass load material portion 4 is made larger than the value of "d×ρ," of the upper electrode 2a.

In this embodiment, because the first mass load material portion 4 is formed by a two layer film composed of the first auxiliary electrode 2b and the load material layer 4a, and the first auxiliary electrode 2b is formed with the same material and in the same thickness as those of the upper electrode 2a, regardless of the thickness and the density of the load material layer 4a, the mass load of the mass load region 7 is made larger than the mass effect of the center region 6 by the amount of the load material layer 4a. Accordingly, energy trapping can be achieved easily.

Furthermore, because the upper electrode 2a and the first auxiliary electrode 2b can be formed in the common process, it is possible to form easily the spacing region "g" where the outer periphery of the planar region of the upper electrode 2a and the inner periphery of the planar region of the first mass load material portion 4 are spaced apart. In other words, the spacing region "g" is formed by dividing the conductive material layer into the upper electrode 2a and the first auxiliary electrode 2b by etching, and thus for the formation of the spacing region "g", it is only necessary to consider the precision of an etching mask.

In contrast, in the case where the upper electrode 2a and the first mass load material portion 4 are formed by completely different steps, for example, precision is also required to align a mask for forming the first mass load material portion 4 with the previously formed upper electrode 2a, in addition to the precision of the mask for forming each layer. In view of the fact that the dimension of the spacing region "g" is in a micrometer scale, highly precise control is required, causing an increase in production cost.

The resonator of this embodiment is configured to utilize thickness longitudinal vibration generated by applying an electric field between the upper electrode 2a and the lower electrode 3. In order to ensure the thickness longitudinal vibration, as shown in FIG. 2, a cavity 9 is formed inside the substrate 8. It is preferable that the mass load region 7, that is, the first mass load material portion 4 is disposed in the center area relative to the edge of the surface of the cavity 9 in contact with the resonator. The cavity 9 can be formed by a sacrificial layer etching process, an etching process from the back surface of substrate using a micromachining method, or the like, but the effects of the present invention are not affected by the selection of the process.

Figure 4:
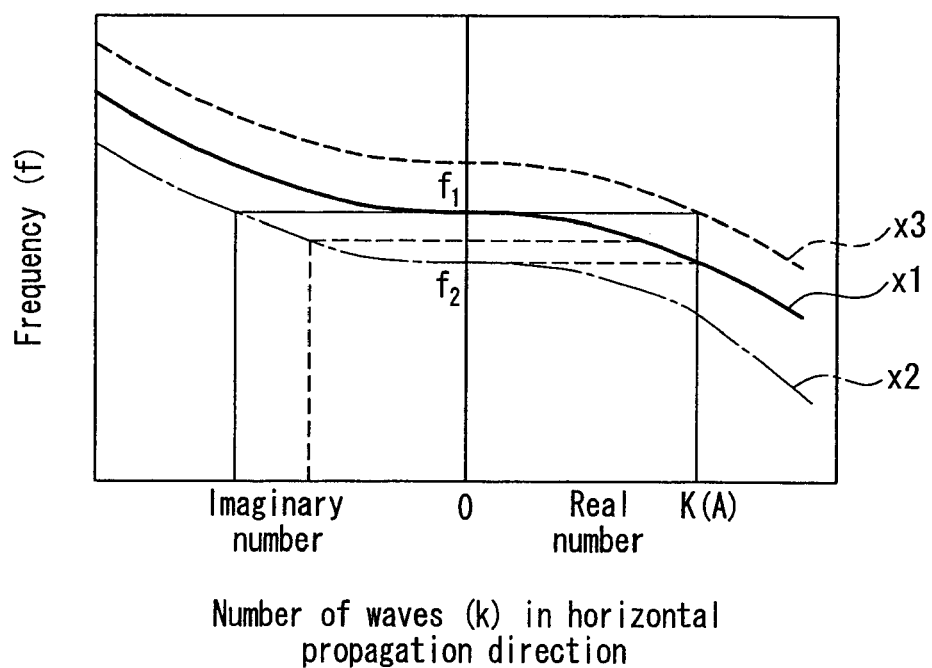
FIG. 4 is a graph showing the dispersion characteristics of the film bulk acoustic wave resonator.

The operation principle of the film bulk acoustic wave resonator of this embodiment will now be described. FIG. 4 shows the dispersion characteristics of the film bulk acoustic wave resonator of this embodiment. The horizontal axis represents the number of acoustic waves in the horizontal direction, and the vertical axis represents frequency. In the region right of the center of the horizontal axis (k=0), the number of waves is expressed in real numbers, indicating that the acoustic waves propagate in the horizontal direction. In the region left of the same, the number of waves is expressed in imaginary numbers, indicating that the acoustic waves do not propagate in the horizontal direction. Accordingly, the point at which the dispersion characteristics intersect the center of the horizontal axis (k=0) is a cutoff frequency. In FIG. 4, the curve x1 represents the dispersion characteristics of the center region 6, and the curve x2 represents the dispersion characteristics of the mass load region 7. Note that, the calculation is made based on the assumption that the mass load effect of the mass load region 7 is larger than that of the center region 6.

Because aluminum nitride (AlN) is used as the material of the piezoelectric body 1, the high-cut-type dispersion characteristics are exhibited. In this connection, the dispersion characteristics are determined mainly by the thickness, density and Poisson's ratio of the piezoelectric body 1, and the thickness and density of the layers formed on the piezoelectric body 1 such as the upper electrode 2a, the lower electrode 3 and the first mass load material portion 4. When the Poisson's ratio of the piezoelectric body 1 is less than 1/3, high-cut-type dispersion characteristics are exhibited. Conversely, when a piezoelectric material having a Poisson's ratio of not less than 1/3 is used, such as zinc oxide (ZnO), low-cut-type dispersion characteristics are exhibited.

As shown in FIG. 4, the curve x2 corresponding to the mass load region 7 having a larger mass load effect lies at a frequency lower than the curve x1 corresponding to the center region 6. Thereby, the cutoff frequency "f2" of the mass load region 7 becomes lower than the cutoff frequency "f1" of the center region 6 cutoff frequency. For this reason, between the cutoff frequency "f1" of the center region 6 and the cutoff frequency "f1" of the mass load region 7, the acoustic waves propagate in the center region 6, and are interrupted in the mass load region 7. Therefore, the acoustic waves are reflected in the boundary region between the center region 6 and the mass load region 7, so that the energy of the acoustic waves can be trapped in the center region 6.

At the same time, because the upper electrode 2a and the first mass load material portion 4 are electrically insulated from each other, the electric energy is prevented from being used in the mass load region 7, so that a resonance mode at a frequency different from that of the main resonance mode should not be generated. In other words, because the electric energy can be converted to the maximum mechanical resonance only in the center region 6, excellent characteristics of the main resonance mode can be obtained.

The distance g (See FIG. 1. The same sign as that for the spacing region "g" is used for convenience of description) by which the outer periphery of the planar region of the upper electrode 2a and the inner periphery of the planar region of the first mass load material portion 4 are spaced apart can be set to fall within a range as given below to obtain practically preferred effects. Here, the thickness of the piezoelectric body 1 is represented by dp, the relative dielectric constant of the piezoelectric body 1 in the thickness direction is represented by $\epsilon 33$, and the relative dielectric constant in the plane direction is represented by $\epsilon 11$.

First the lower limit value of the distance g is set to fall within the range defined by the following expression:

$$g \geq dp \times \epsilon 11 / [33.$$

This makes the degree of coupling in the plane direction smaller than the capacitive coupling in the thickness direction. For example, in the case of using a piezoelectric body (ALN) having a thickness dp of 1.1 μm, the ALN has a value of $\epsilon 11$ nearly equal to 8 ($\epsilon 11 \approx 8$), and a value of $\epsilon 33$ nearly equal to 11 ($\epsilon 33 \approx 11$), the distance g can be set to 0.8 μm or greater.

Further, the upper limit value of the distance g is set to satisfy the following expression:

$$g < \lambda h.$$

That is, the distance g is set to be less than a single wavelength λh of vibration in the plane direction. When the distance g is not less than the single wavelength of vibration in the plane direction, the trapping effect will be reduced.

The dispersion curve of the region in the distance g of FIG. 1 is indicated by X3 in FIG. 4. $\lambda h=2\pi/k$ (A) is obtained when converted from the number of waves k (A) in the center region 6 at the resonance frequency f1. Accordingly, when the thicknesses of Mo, ALN and Mo are 0.3, 1.1 and 0.3 µm, respectively, the single wavelength equals 3.5 µm.

Figure 5:
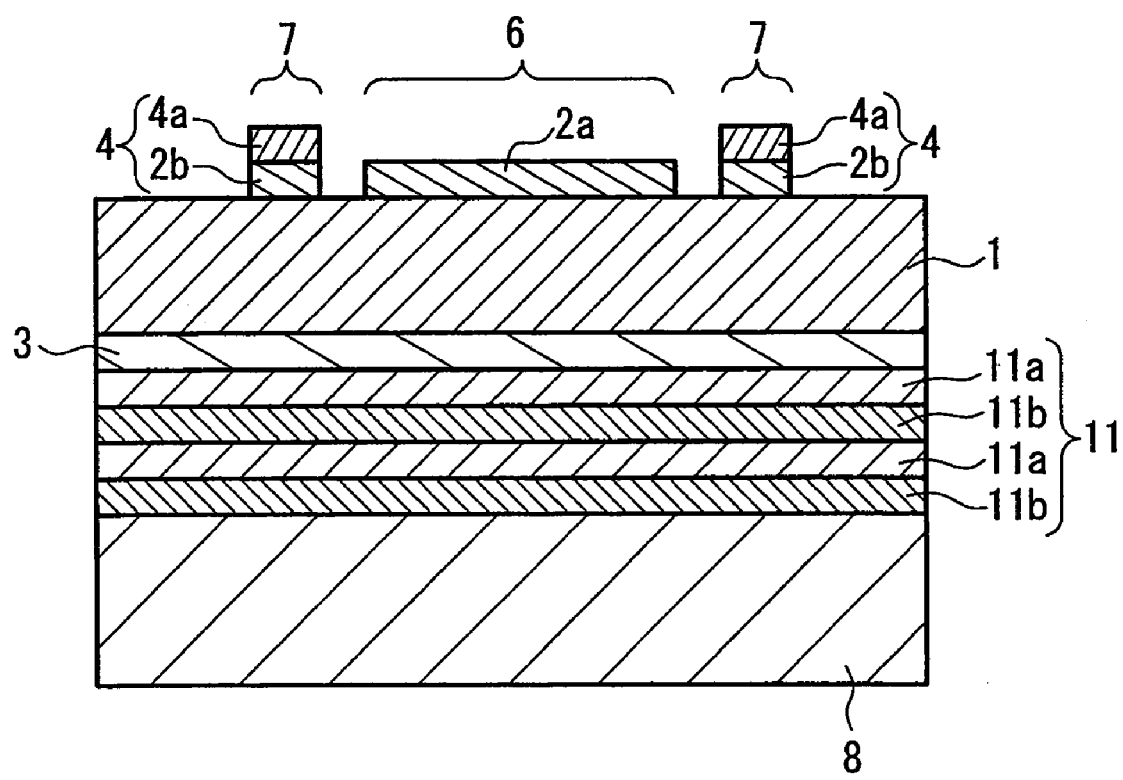
FIG. 5 is a cross sectional view showing another configuration of the film bulk acoustic wave resonator according to the first embodiment of the present invention.

The foregoing discusses the case where the substrate 8 is provided with the cavity 9 as a support structure for the resonance portion to ensure thickness longitudinal vibration, but as shown in FIG. 5, it is also possible to obtain energy trapping effect similar to the above example even when an acoustic mirror 11 is used as a support structure for the resonance portion. In other words, instead of forming the cavity 9 in the substrate 8, an acoustic mirror 11 may be disposed between the substrate 8 and the lower electrode 3. The acoustic mirror 11 is formed by alternately disposing low acoustic impedance layers 11a and high acoustic impedance layers 11b. The low acoustic impedance layers 11a have a thickness equal to ¼ wavelength calculated from the resonance frequency of the main resonance mode.

In the above-described configuration, even when the material of the load material layer 4a is the same conductive material as that of the first auxiliary electrode 2b, a conductive material different from that of the first auxiliary electrode 2b or an insulating material, similar effects can be obtained.

Second Embodiment

Figure 6:
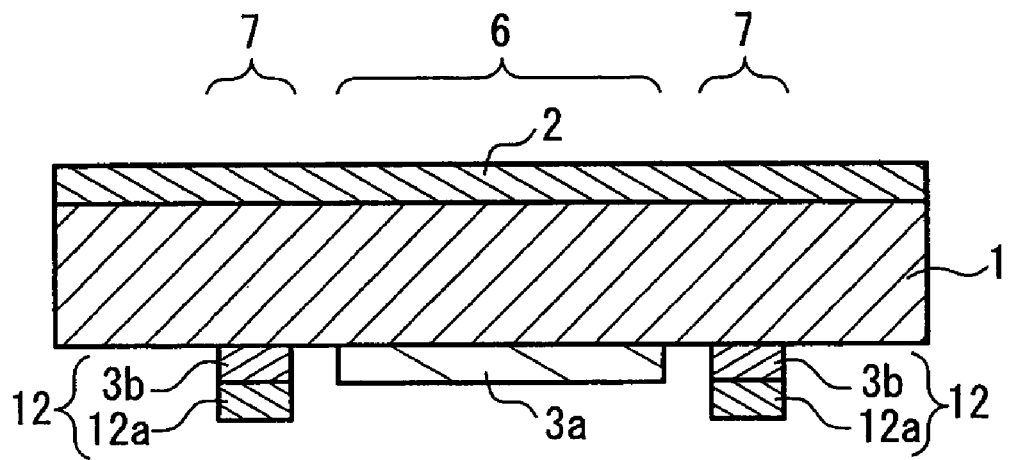
FIG. 6 is a cross sectional view showing the configuration of the resonance portion of a film bulk acoustic wave resonator according to a second embodiment of the present invention.

FIG. 6 is a cross sectional view showing an example of the structure of the resonance portion of a film bulk acoustic wave resonator according to a second embodiment of the present invention. The film bulk acoustic wave resonator according to this embodiment has a structure in which a lower electrode 3a, a piezoelectric body 1 and an upper electrode 2 are formed, in this order, on a substrate (not shown). The lower electrode 3a is formed only within a center region 6. A second mass load material portion 12 is formed outside of the lower electrode 3a between the substrate and the piezoelectric body 1. The lower electrode 3a, the piezoelectric body 1 and the upper electrode 2 together form the center region 6, and the second mass load material portion 12, the piezoelectric body 1 and the upper electrode 2 together form a mass load region 7. The outer periphery of the lower electrode 3a and the inner periphery of the second mass load material portion 12 are spaced apart from each other, whereby an electrical insulation is ensured between the center region 6 and the mass load region 7.

The second mass load material portion 12 is formed by a second auxiliary electrode 3b and a load material layer 12a. The second auxiliary electrode 3b is formed with the same conductive material as that of the lower electrode 3a in the common process. The material of the load material layer 12a can be selected similarly to the load material layer 4a of the first mass load material portion 4.

In order to obtain a structure in which the resonance portion of this embodiment is supported on a substrate 8 just like the film bulk acoustic wave resonator of FIG. 2, for example, the structure can be produced by forming a resonance portion as shown in FIG. 1, and then bonding the resonance portion to a support substrate having a cavity portion with the resonance portion being turned upside down. That is, the substrate 8 is provided with a support portion in the periphery thereof and the resonance portion shown in FIG. 6 is supported by the support portion. Accordingly, the substrate 8 and the resonance portion shown in FIG. 6 are connected only at the support portion. In this case, it is preferable that the second mass load material portion 12 of FIG. 6 is disposed such that it does not contact the substrate. Such a configuration can be produced easily by a transfer process that will be described in the following with reference to FIGS. 8A to 8E.

In order to use a piezoelectric material having high-cut-type dispersion characteristics to form the piezoelectric body 1, and to realize energy trapping, the mass load effect of the mass load region 7 is made larger than that of the center region 6. In other words, when the thickness of the upper electrode 2 is uniform throughout the center region 6 and the mass load region 7, the value of "d×ρ" of the second mass load material portion 12 is made larger than the value of "d×ρ" of the lower electrode 3a. In this embodiment, similarly to the first embodiment, regardless of the thickness and density of the load material layer 12a, the value of "d×ρ" of second mass load material portion 12 is made larger than the value of "d×ρ" of the lower electrode 3a by the amount of the load material layer 12a.

Although not shown, by removing the second mass load material portion 12 in the region in which the leading portion of the lower electrode 3a is formed, the leading portion of the lower electrode 3a and the second mass load material portion 12 are spaced apart from each other. Accordingly, the second mass load material portion 12 and the leading portion of the lower electrode 3a are electrically insulated from each other. Thereby, it is possible to prevent an electrical connection between the lower electrode 3a and the second mass load material portion 12 through the leading portion of the lower electrode 3a.

As described above, similarly to the operation principle of the first embodiment, the film bulk acoustic wave resonator of this embodiment can achieve the energy trapping in the center region 6, and suppress the generation of different resonance modes by the electrical insulation between the lower electrode 3a and the second mass load material portion 12. Therefore, excellent characteristics of the main resonance mode can be obtained.

Figure 7:
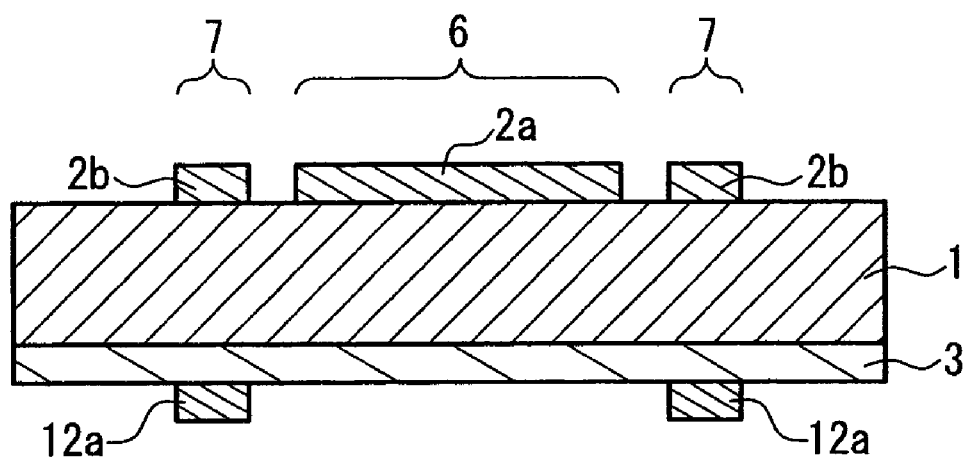
FIG. 7 is a cross sectional view showing another configuration of the resonance portion of a film bulk acoustic wave resonator according to a second embodiment of the present invention.

It is also possible to form the mass load region by employing a structure as shown in FIG. 7. Specifically, a conductive material layer (not shown) made of the same material as that of the upper electrode 2a is first formed over the center region 6 and the mass load region 7 on the piezoelectric body 1, and then the conductive material layer is etched to form a gap between the center region 6 and the mass load region 7 so as to divide (patterning) into an upper electrode 2a and a first auxiliary electrode 2b. Then, a lower electrode 3 is formed on the entire underside of the piezoelectric body, and a load material layer 12a is provided on the lower electrode in a position corresponding to the first auxiliary electrode 2b of the mass load region 7. Thereby, a second mass load material portion is formed of a Laminated structure including load material layer 12a and a part of the lower electrode 3 facing the load material layer 12a.

According to this structure also, regardless of the thickness and density of the load material layer 12a, the mass load of the mass load region 7 becomes larger than the mass effect of the center region 6, so that energy trapping can be achieved. Further, because the upper electrode 2a and the first auxiliary electrode 2b are spaced apart from each other, the center region 6 and the mass load region 7 are electrically insulated from each other.

In the resonators configured as shown in FIGS. 6 and 7, similarly to the film bulk acoustic wave resonator of the first embodiment, it is preferable to form a cavity in the substrate 8 to ensure thickness longitudinal vibration. In this case, it is preferable that the mass load region 7, that is, the second mass load material portion 12 is disposed in the center area relative to the edge of the cavity in contact with the resonator, in other words, within the area of the cavity. Instead of forming the cavity, as shown in FIG. 5, an acoustic mirror may be disposed between the substrate 8 and the lower electrode 3 to ensure the support and the thickness longitudinal vibration.

The film bulk acoustic wave resonator shown in FIG. 7 can be produced using a transfer process. A flow of steps of a transfer process is shown in FIGS. 8A to 8E.

Figure 8A:
FIGS. 8A to 8E are cross sectional views showing a production process of a film bulk acoustic wave resonator having the structure shown in FIG. 7.
Figure 8B:
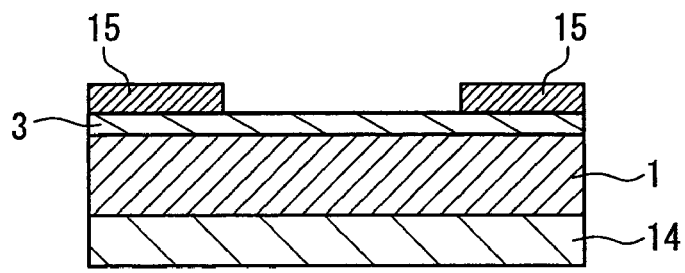
Figure 8C:
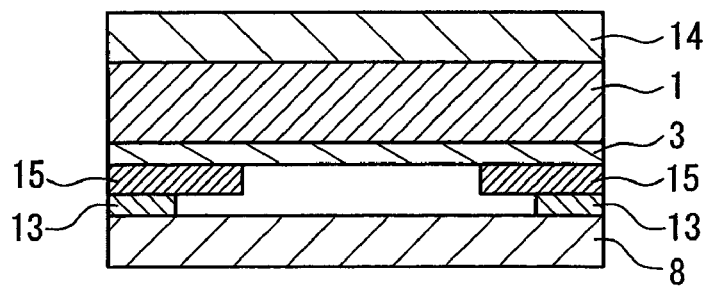
Figure 8D:
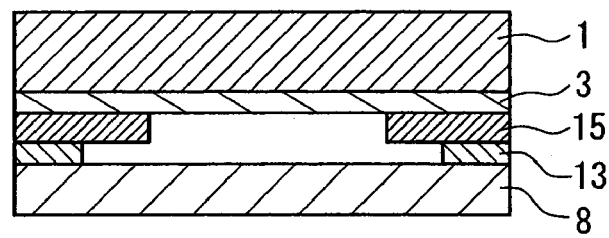
Figure 8E:
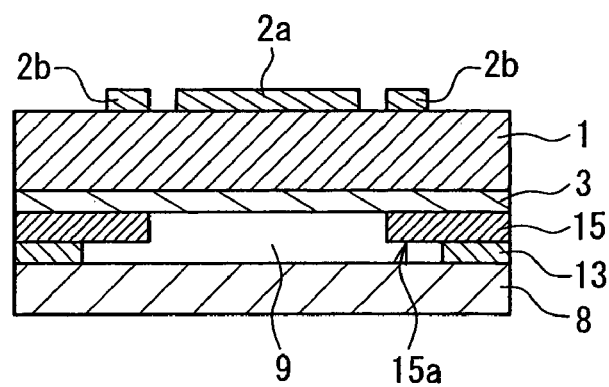

First, as shown in FIG. 8A, a first support portion 13 is formed on a substrate 8. Subsequently, as shown in FIG. 8B, a piezoelectric body 1, a lower electrode 3 and a second support portion 15 are formed on an auxiliary substrate 14 by deposition in this order. Then, as shown in FIG. 8C, the structure of FIG. 8A and that of FIG. 8B are joined together by bringing the first support portion 13 and the second support portion 15 into contact with each other. Thereafter, as shown in FIG. 8D, the auxiliary substrate 14 is removed. Finally, as shown in FIG. 8E, an upper electrode 2a and a first auxiliary electrode 2b are formed.

In the above process, the second support portion 15 is made larger than the first support portion 13. And, the protruding portion 15a of the second support portion 15 that is a inner peripheral region of the first support portion 13 is formed such that the protruding portion 15a faces the first auxiliary electrode 2b. The first and second support portions 13 and 15, the substrate 8 and the lower electrode 3 together form a cavity 9. Because the protruding portion 15a of the second support portion 15 lies on the center side from the inner periphery of the first support portion 13, the suppression of vibration leakage can be obtained by energy trapping. Further, because the upper electrode 2a and the first auxiliary electrode 2b are spaced apart from each other in the radial direction, it is also possible to suppress the generation of different resonance modes, so that excellent characteristics of the main resonance mode can be obtained.

In the manner described above, the film bulk acoustic wave resonator according to this embodiment shown in FIG. 7 can be produced. Note that, although the second support portion 15 functions similarly to the load material layer 12a of FIG. 7, unlike the load material layer 12a, the second support portion 15 extends further outward than the outer periphery of the first auxiliary electrode 2b. It is to be understood that the method for producing the film bulk acoustic wave resonator of FIG. 7 is not limited thereto.

Third Embodiment

Figure 9:
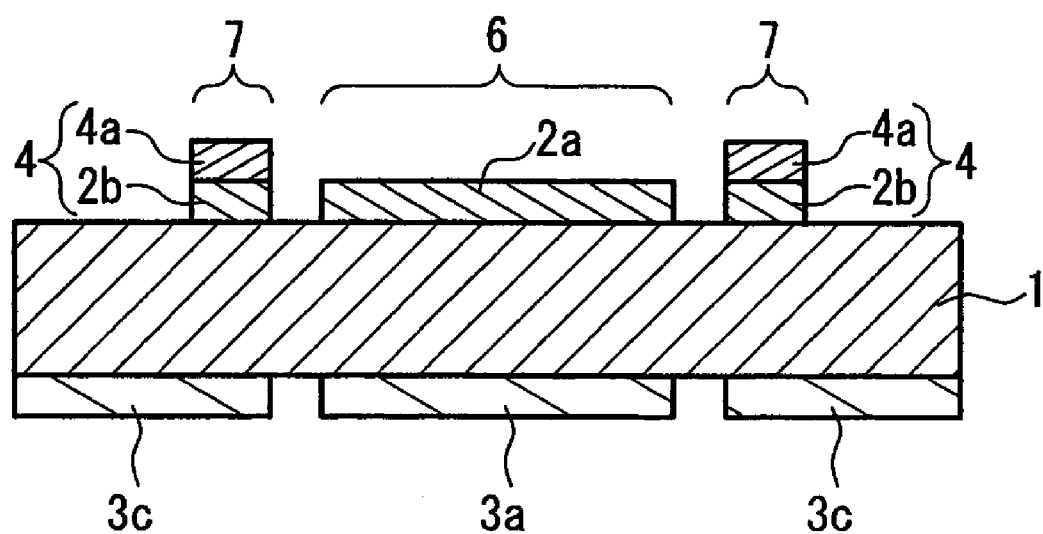
FIG. 9 is a cross sectional view showing a configuration of the resonance portion of a film bulk acoustic wave resonator according to a third embodiment of the present invention.

FIG. 9 is a cross sectional view showing an example of the structure of the resonance portion of a film bulk acoustic wave resonator according to a third embodiment of the present invention. The film bulk acoustic wave resonator of this embodiment has a structure in which, in the film bulk acoustic wave resonator of the first embodiment shown in FIG. 1, the lower electrode 3 is divided at the boundary region between the center region 6 and the mass load region 7 so as to be patterned into a center lower electrode 3a and a second mass load material portion 3c.

In the structure of FIG. 1, strictly speaking, the electric field applied between the upper electrode 2a and the lower electrode 3 is not limited to the thickness direction. For this reason, when one of the upper electrode 2a and the lower electrode 3 is not divided, vibration in an oblique direction also may be generated, which contributes to the generation of different resonance modes.

In contrast, by providing electrical insulation between the center region 6 and the mass load region 7 in both the upper electrode 2a and the lower electrode 3a, the generation of different resonance modes can be suppressed more sufficiently. Thereby, the characteristics of the main resonance mode can be improved more effectively.

Although the lower electrode 3a and the second mass load material portion 3c are formed with the same material to have the same thickness in FIG. 9, it is also possible to use different materials and different thicknesses so as to allow the second mass load material portion 3c to function more appropriately. As long as the first mass load material portion 4 can exhibit a mass load effect larger than those of both center region electrodes 2a and 3a when combined with the first mass load material portion 4, the trapping effect of the present invention can be obtained.

However, if the upper electrode 2a and the second mass load material portion 3c, or the lower electrode 3a and the first mass load material portion 4 are disposed to face each other with the piezoelectric body 1 interposed therebetween, a resonance portion will be formed in the facing region therebetween. This generates an unwanted resonance at a frequency different from the resonance frequency of the center region 6 and reduces the amount of energy used in the center region 6, causing characteristic degradation. Accordingly, it is preferable that the upper electrode 2a and the second mass load material portion 3c, or the lower electrode 3a and the first mass load material portion 4 are disposed such that they do not face each other with the piezoelectric body 1 interposed therebetween.

As shown in FIG. 3, the first mass load material portion 4 is removed in the region in which the leading wiring 10 is formed, so as to form a cut-off portion 5. Likewise, a cut-off portion is formed also in the second mass load material portion 3c, whereby the leading wiring of the center lower electrode 3a can be disposed such that it is spaced apart from the second mass load material portion 3c.

On the other hand, because the first mass load material portion 4 is coupled to the lower electrode 3a via the piezoelectric body 1 in the region where it faces the leading wiring of the lower electrode 3a with the piezoelectric body 1 interposed therebetween, it is preferable to avoid the coupling by removing the region of the first mass load material portion 4 that faces the leading wiring of the lower electrode 3a. Likewise, it is preferable to remove the region of the second mass load material portion 3b that faces the leading wiring of the upper electrode 2a.

The structure in which the lower electrode is divided as described above can be applied similarly to other film bulk acoustic wave resonators of all the embodiments described above. Specifically, both the upper electrode 2a and the lower electrode 3a are divided (by patterning) at the boundary region between the center region 6 and the mass load region 7 of the boundary region for electrical insulation, the generation of different resonance modes can be suppressed sufficiently, and so the characteristics of the main resonance mode can be improved more effectively.

Fourth Embodiment

Figure 10A:
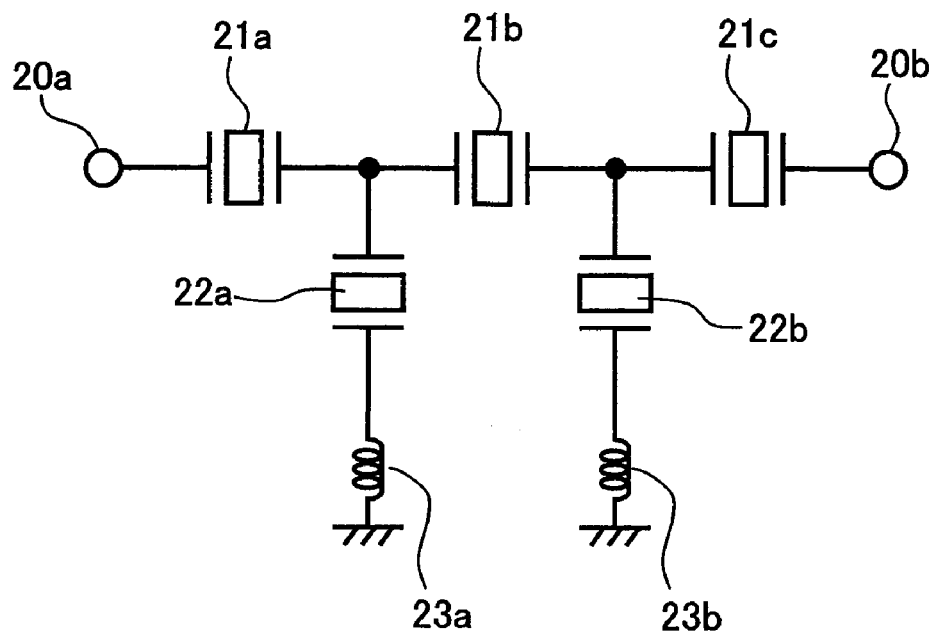
FIG. 10A is a circuit diagram showing an example of a configuration of a high frequency circuit component according to a fourth embodiment of the present invention

FIG. 10A is a circuit configuration of a high frequency circuit component according to a fourth embodiment of the present invention. Series film bulk acoustic wave resonators 21a, 21b and 21c, and parallel film bulk acoustic wave resonators 22a and 22b are connected in the form of a ladder between input and output terminals 20a and 20b. The parallel film bulk acoustic wave resonators 22a and 22b are grounded through inductors 23a and 23b, respectively. A high frequency band-pass filter is formed by setting the resonance frequency of the series film bulk acoustic wave resonator 21a, 21b and 21c and the antiresonance frequency of the parallel piezoelectric resonators 22a and 22b to be substantially coincident with each other.

Figure 10B:
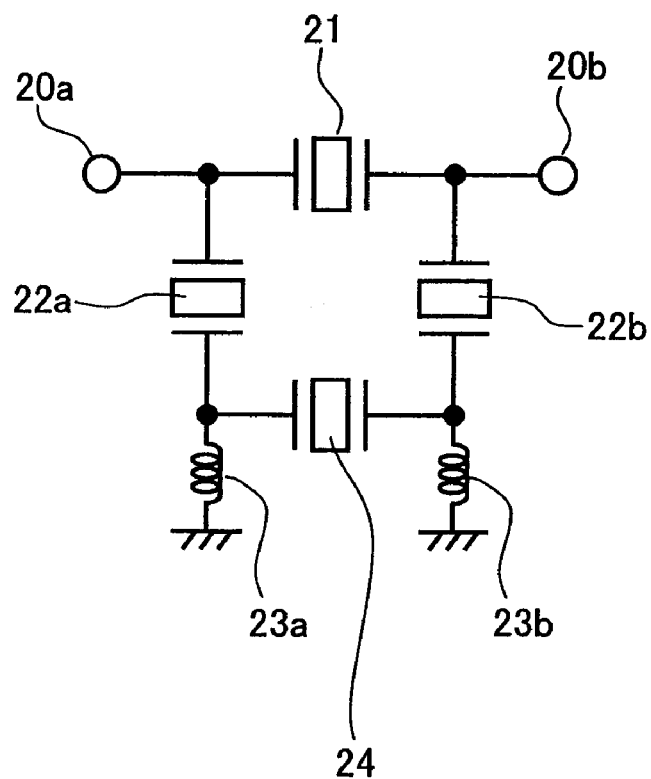
FIG. 10B is a circuit diagram showing another example of a configuration of a high frequency circuit component according to the same embodiment.

FIG. 10B shows the circuit configuration of a high frequency circuit component of another example of the fourth embodiment of the present invention. A series film bulk acoustic wave resonator 21 and parallel film bulk acoustic wave resonators 22a and 22b are connected between input and output terminals 20a and 20b. The parallel film bulk acoustic wave resonators 22a and 22b are grounded through inductors 23a and 23b, respectively. A node between the parallel film bulk acoustic wave resonator 22a and the inductor 23a and a node between the parallel film bulk acoustic wave resonator 22b and the inductor 23b are connected by a bypass film bulk acoustic wave resonator 24.

The resonance frequencies of the series film bulk acoustic wave resonator 21, the parallel film bulk acoustic wave resonators 22a and 22b, and the bypass film bulk acoustic wave resonator 24 are set, although they vary according to filter characteristics required, such that the resonance frequency of the series film bulk acoustic wave resonator 21 and the antiresonance frequencies of the parallel film bulk acoustic wave resonators 22a and 22b are substantially coincident with each other, and the resonance frequency of the bypass film bulk acoustic wave resonator 24 is lower than the resonance frequency of the parallel film bulk acoustic wave resonator 22. Thereby, a low-loss band-pass filter having a large out-of-band attenuation is formed.

By applying one of the configurations of the above-described embodiments to one of the film bulk acoustic wave resonators 21, 21a, 21b, 21c, 22a, 22b and 24 of the high frequency circuit component having the above-described configuration, it is possible to obtain a low-loss high frequency filter having no spuriousness in the out-of-band attenuation region and excellent skirt characteristics.

It is to be understood that the circuit configuration of the high frequency circuit component of this embodiment are merely exemplary, and the number of stages (the number of film bulk acoustic wave resonators) is not limited thereto. Further, the high frequency circuit component of this embodiment is applicable to various filters that utilize film bulk acoustic wave resonators, such as a lattice filter and a multimode filter in which a plurality of resonators are adjacently disposed in a plane direction or the thickness direction.

Figure 11:
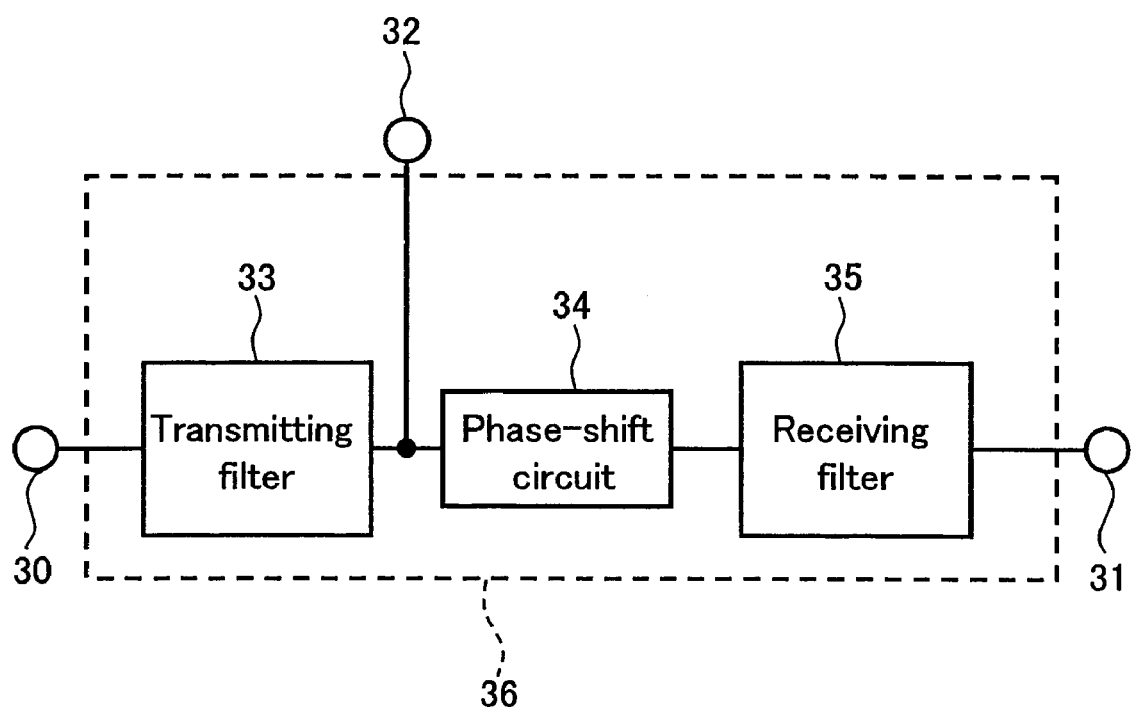
FIG. 11 is a block diagram showing an example of a configuration of a duplexer having a filter including the film bulk acoustic wave resonator of the present invention.

The band-pass filters that include the film bulk acoustic wave resonators according the embodiments of the present invention can be used for an antenna duplexer 36 as shown in FIG. 11. The antenna duplexer 36 of FIG. 11 has a transmitting terminal 30, a receiving terminal 31 and an antenna terminal 32. A transmitting filter 33, a phase-shift circuit 34 and a receiving filter 35 are disposed in this order between the transmitting terminal 30 and the receiving terminal 31. The antenna terminal 32 is connected between the transmitting filter 33 and the phase-shift circuit 34. One of the band-pass filters including the film bulk acoustic wave resonators according the embodiments of the present invention is included as at least one of the transmitting filter 33 and the receiving filter 35.

Figure 12:
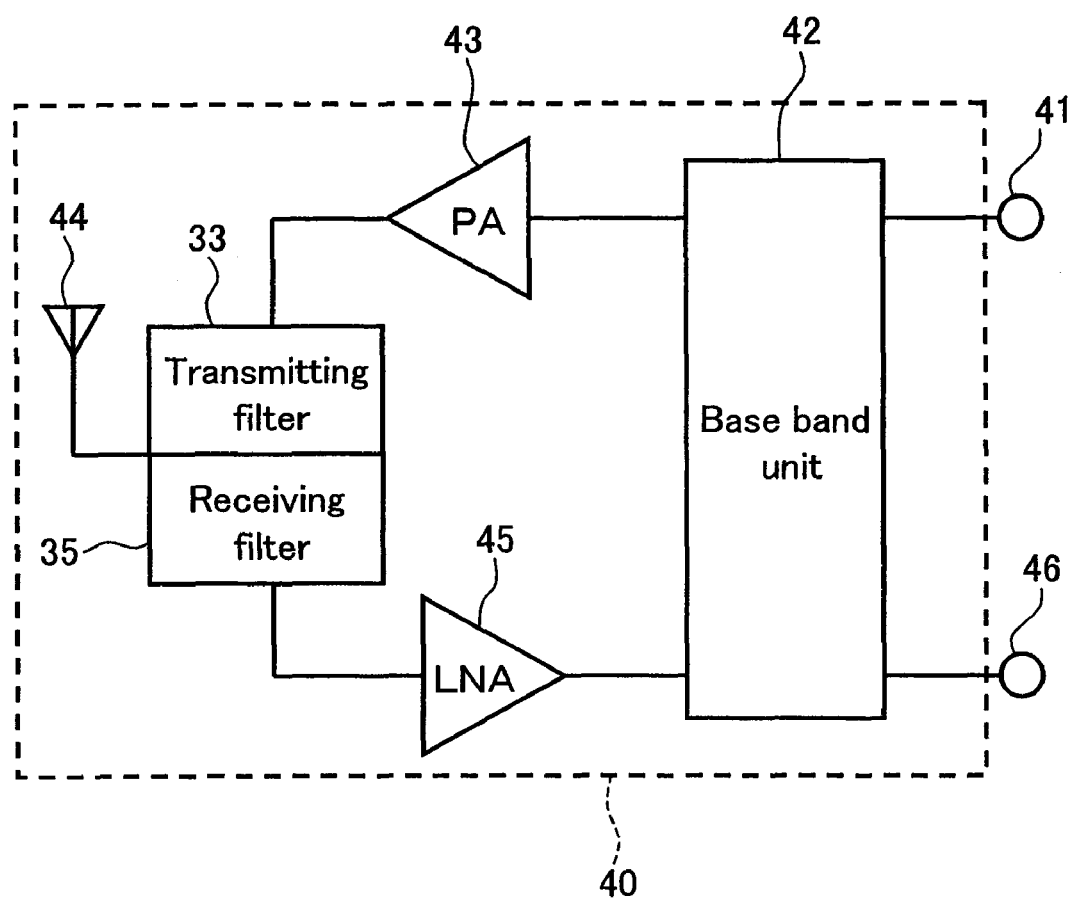
FIG. 12 is a block diagram showing an example of a configuration of a communication device having a filter including the film bulk acoustic wave resonator of the present invention.
Figure 13:
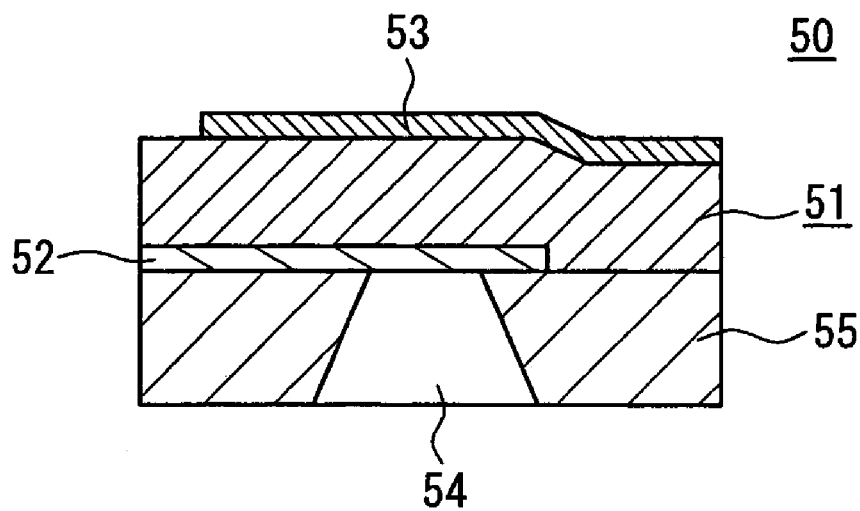
FIG. 13 is a cross sectional view showing a configuration of a conventional film bulk acoustic wave resonator.
Figure 14:
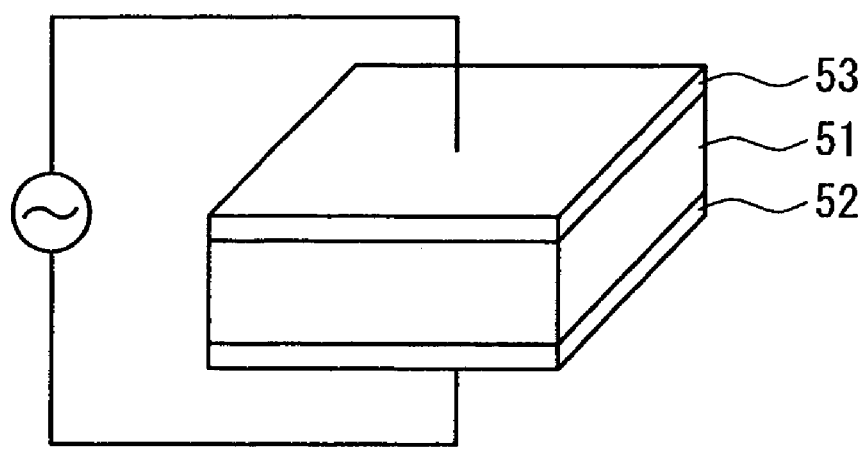
FIG. 14 is a perspective view showing a configuration of a conventional film bulk acoustic wave resonator.
Figure 15A:
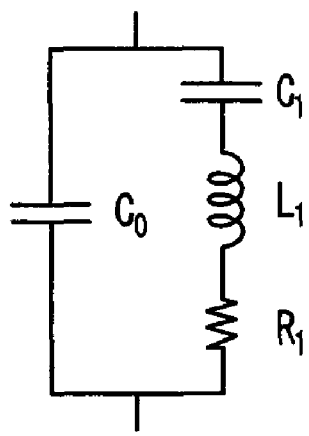
FIG. 15A is a circuit diagram of an equivalent circuit of a conventional film bulk acoustic wave resonator.
Figure 15B:
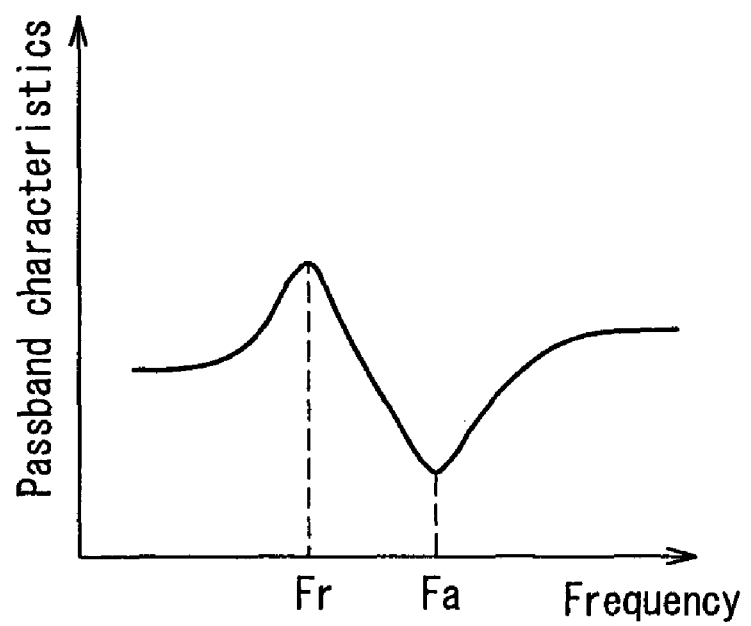
FIG. 15B is a graph showing admittance frequency characteristics of the film bulk acoustic wave resonator in FIG. 15A.
Figure 16A:
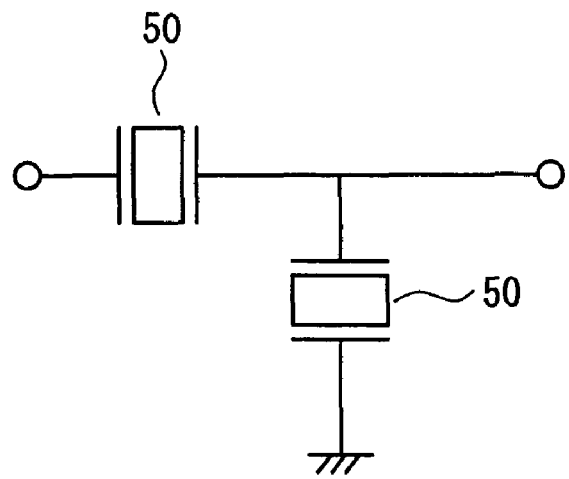
FIG. 16A is a diagram of a configuration of a filter including a conventional film bulk acoustic wave resonator.
Figure 16B:
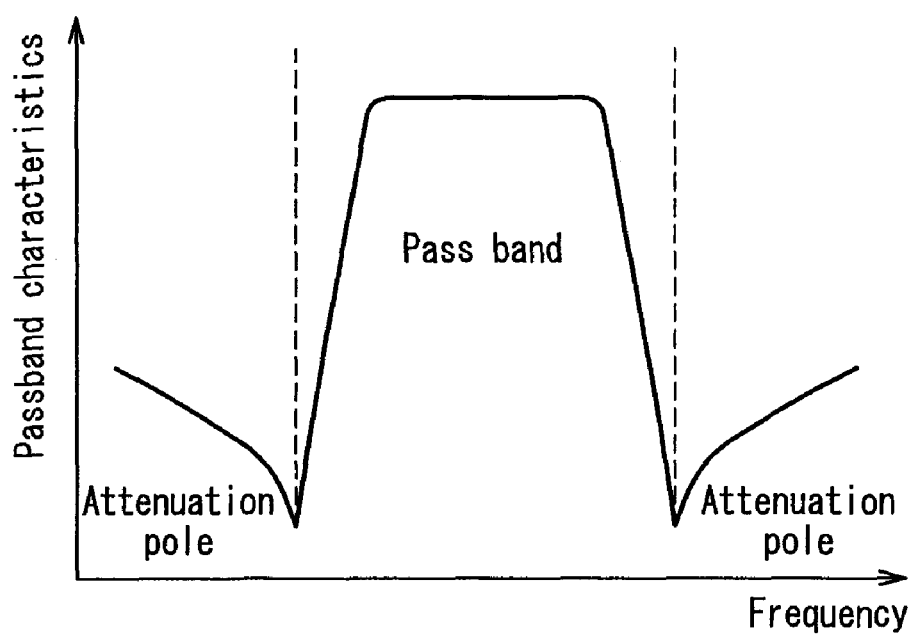
FIG. 16B is a graph of passband characteristics of the filter of FIG. 16A.
Figure 17A:
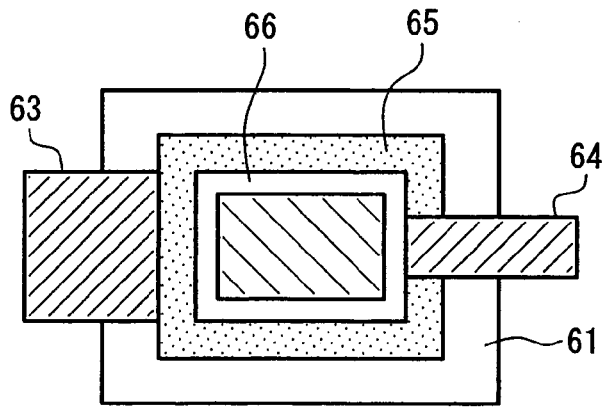
FIG. 17A is a plan view showing a configuration of a film bulk acoustic wave resonator of a conventional example for realizing energy trapping.
Figure 17B:
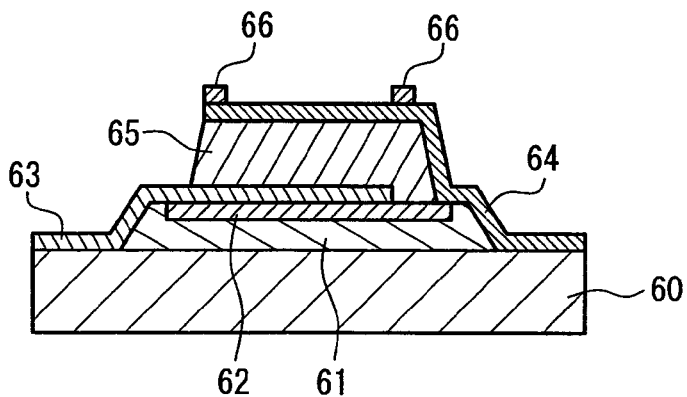
FIG. 17B is a side view showing a cross section viewed from the front of FIG. 17A.
Figure 17C:
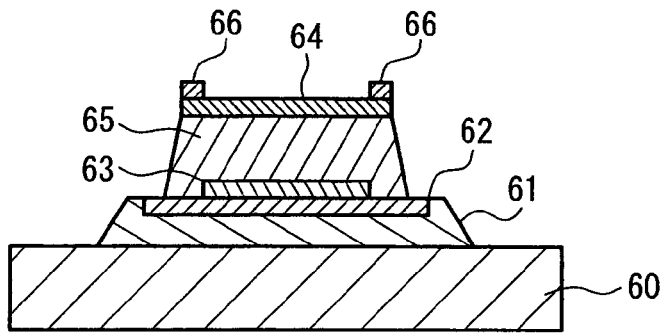
FIG. 17C is a cross sectional view taken from a side of FIG. 17A.
Figure 18A:
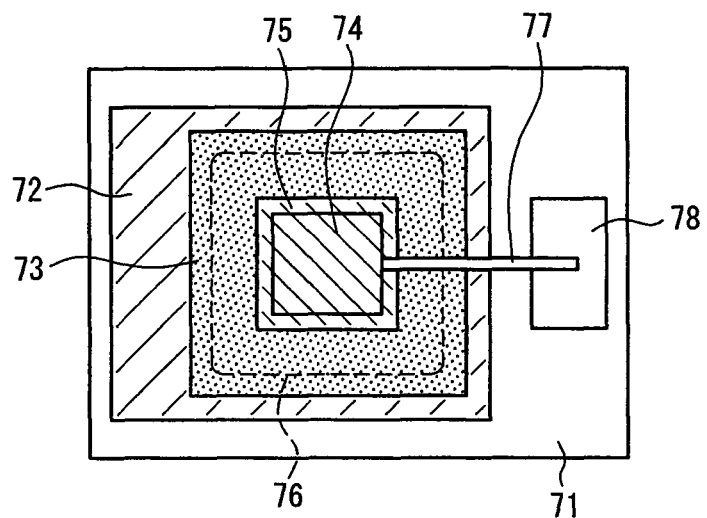
FIG. 18A is a plan view showing a configuration of a film bulk acoustic wave resonator of another conventional example for realizing energy trapping.
Figure 18B:
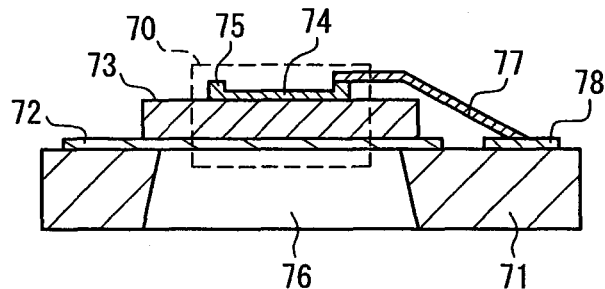
FIG. 18B is a cross sectional view of the film bulk acoustic wave resonator in FIG. 18A.
Figure 18C:
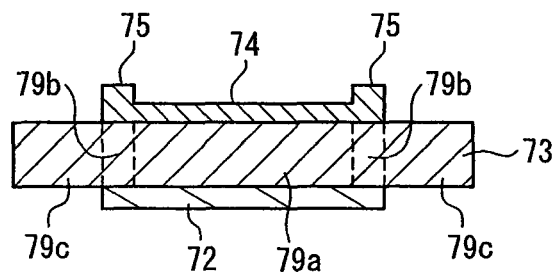
FIG. 18C is a cross sectional view of an enlarged relevant portion of the film bulk acoustic wave resonator in FIG. 18A.
Figure 18D:
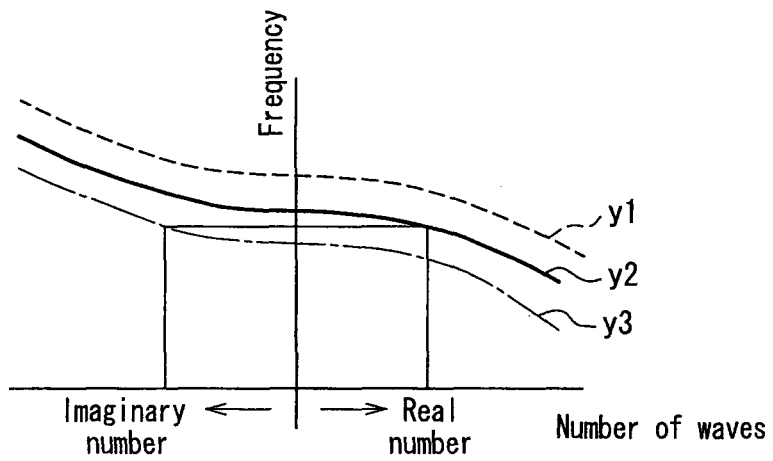
FIG. 18D is a characteristic graph used to illustrate the film bulk acoustic wave resonator in FIG. 18A.
Figure 19A:
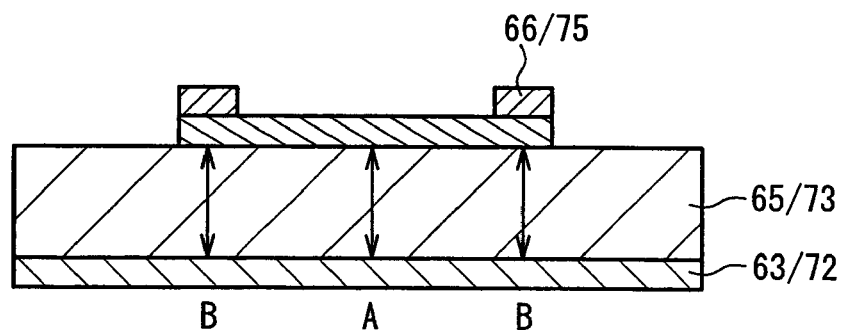
FIG. 19A is a cross sectional view of a film bulk acoustic wave resonator used to illustrate a problem associated with a conventional structure for realizing energy trapping.
Figure 19B:
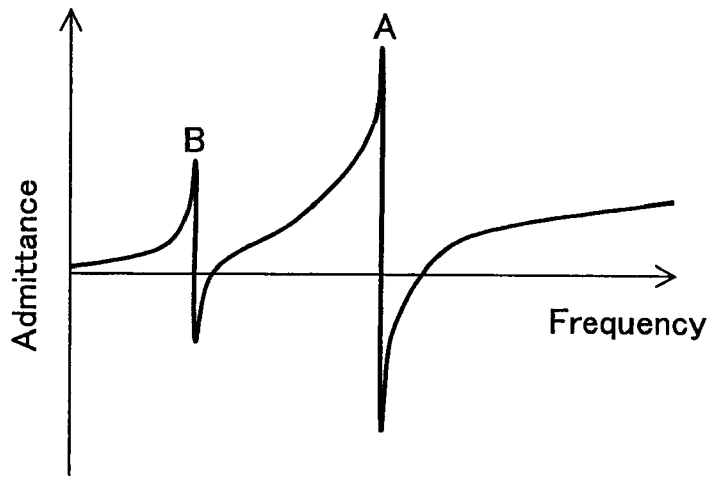
FIG. 19B is a graph showing a resonance mode of the film bulk acoustic wave resonator of FIG. 19A.
Figure 19C:
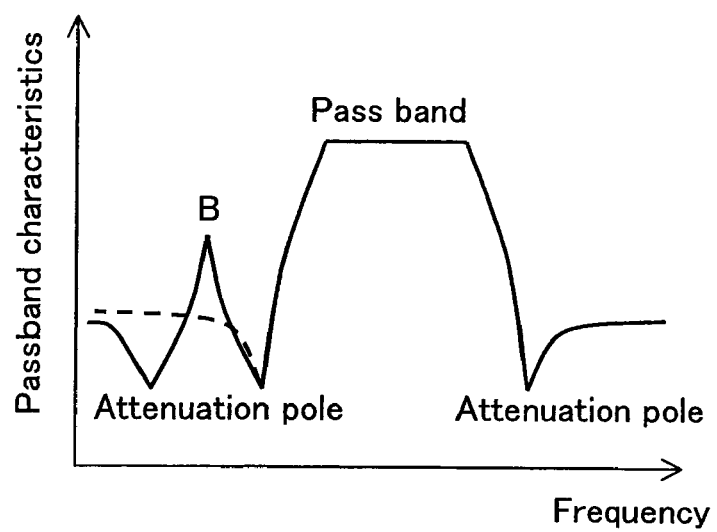
FIG. 19C is a graph showing the passband characteristics of the film bulk acoustic wave resonator of FIG. 19A.
Figure 20A:
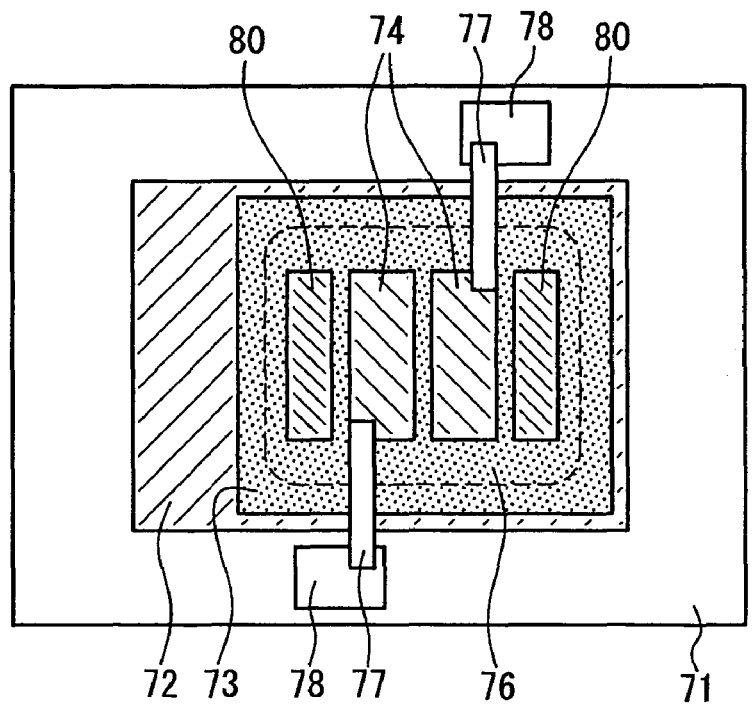
FIG. 20A is a plan view of a film bulk acoustic wave resonator of still another conventional example for realizing energy trapping.
Figure 20B:
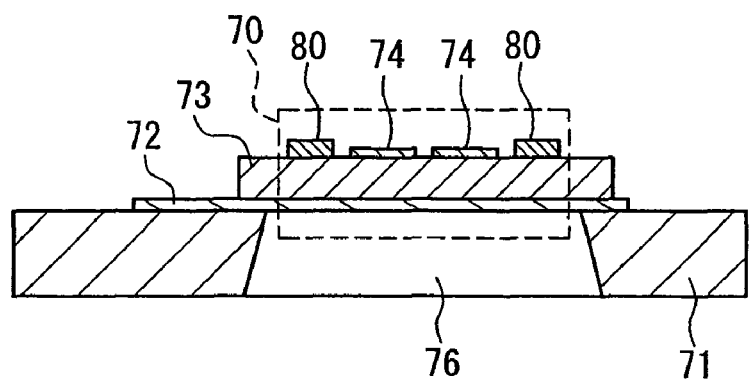
FIG. 20B is a cross sectional view of the film bulk acoustic wave resonator in FIG. 20A.

Also, the band-pass filters that include the film bulk acoustic wave resonators according the embodiments of the present invention can be used for a communication device 40 as shown in FIG. 12. In the communication device 40 of FIG. 12, signals input from a transmitting terminal 41 are passed through a base band unit 42 to a power amplifier 43 where the signals are amplified, which are then passed to a transmitting filter 33 where the signals are filtered, and passed to an antenna 44 from which radio waves are transmitted. The signals received by the antenna 44 are passed through a receiving filter 35 where the signals are filtered, which are then amplified by a LNA 45, after which the signals are transferred through the base band unit 42 to a receiving terminal 46. One of the band-pass filters including the film bulk acoustic wave resonators according the above-described embodiments is included as at least one of the transmitting filter 33 and the receiving filter 35.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A film bulk acoustic wave resonator comprising:
 a piezoelectric body made of a piezoelectric thin film;
 a first electrode provided on one main surface of the piezoelectric body;
 a second electrode provided on the other main surface of the piezoelectric body; and
 a first mass load material portion having an annular shape provided outside the planar region of the first electrode on the main surface of the piezoelectric body on which the first electrode is provided, with a mass load effect of the first mass load material portion being larger than that of the first electrode,
 the piezoelectric body being supplied with an electric field through the first electrode and the second electrode so as to generate a resonant vibration,
 wherein the outer periphery of the planar region of the first electrode and the inner periphery of the annular first mass load material portion are spaced apart from each other, whereby the first electrode and the first mass load material portion are electrically insulated from each other,
 the first mass load material portion has a laminated structure including a first auxiliary electrode and a load material layer formed on the first auxiliary electrode, the first auxiliary electrode being formed with the same material to have the same thickness as the first electrode on the piezoelectric body, and
 a distance g between the outer periphery of the planar region of the first electrode and the inner periphery of the first mass load material portion falls within a range defined by the expression $$g \geq dp \times \epsilon 11/\epsilon 33$$

where dp is the thickness of the piezoelectric body, $\epsilon 33$ is the relative dielectric constant in the thickness direction of the piezoelectric body, and $\epsilon 11$ is the relative dielectric constant in the plane direction of the piezoelectric body.

2. The film bulk acoustic wave resonator according to claim 1,
 wherein the piezoelectric body has high-cut-type dispersion characteristics.

3. The film bulk acoustic wave resonator according to claim 1,
 wherein the piezoelectric body is composed mainly of aluminum nitride (AlN).

4. A high frequency circuit component comprising a plurality of film bulk acoustic wave resonators, wherein at least one of the film bulk acoustic wave resonators is the film bulk acoustic wave resonator according to claim 1.

5. A communication device comprising an antenna, a transmitting circuit and a receiver circuit, wherein a connecting portion between the antenna and the transmitting circuit or the receiver circuit, or at least either one of the transmitting circuit and the receiver circuit comprises the high frequency circuit component according to claim 4.

6. The film bulk acoustic wave resonator according to claim 1, further comprising:

a substrate that supports a resonance portion configured by the piezoelectric body, the first electrode and the second electrode, wherein a cavity is formed in the substrate under the resonance portion.

7. The film bulk acoustic wave resonator according to claim 1, further comprising:

a substrate, and an acoustic mirror provided on the substrate and configured such that a low acoustic impedance layer and a high acoustic impedance layer are alternately disposed, wherein a resonance portion configured by the piezoelectric body, the first electrode and the second electrode is supported on the acoustic mirror.

8. The film bulk acoustic wave resonator according to claim 1, further comprising:

a leading wiring electrode connected to the first electrode, wherein the leading wiring electrode is electrically insulated from the first mass load material portion.

9. The film bulk acoustic wave resonator according to claim 8, wherein the leading wiring electrode is led through a cut-off portion formed in a part of the annular first mass load material portion, and the leading wiring electrode and the first mass load material portion are spaced apart from each other, whereby the leading wiring electrode and the first mass load material portion are electrically insulated from each other.

10. A method for manufacturing a film bulk acoustic wave resonator comprising:

forming a first electrode on one main surface of the piezoelectric body made of a piezoelectric thin film;

forming a first mass load material portion having an annular shape, which is electrically insulated from the first electrode, outside the planar region of the first electrode on the main surface of the piezoelectric body on which the first electrode is formed;

forming a second electrode on the main surface opposite to the main surface of the piezoelectric body on which the first electrode is formed; and forming a second mass load material portion having an annular shape outside the planar region of the second electrode on the main surface of the piezoelectric body on which the second electrode is formed, such that the second mass load material portion faces the first mass load material portion, wherein at least one of the first mass load material portion and the second mass load material portion has a laminated structure including an auxiliary electrode and a load material layer formed on the auxiliary electrode, the auxiliary electrode being formed with the same material to have the same thickness as the first or the second electrode on the piezoelectric body, and a mass load effect obtained by summing the first mass load material portion and the second mass load material portion is set to be greater than a mass load effect obtained by summing the first electrode and the second electrode.

11. A film bulk acoustic wave resonator comprising:

a piezoelectric body made of a piezoelectric thin film;

a first electrode provided on one main surface of the piezoelectric body;

a second electrode provided on the other main surface of the piezoelectric body; and a first mass load material portion having an annular shape provided outside the planar region of the first electrode on the main surface of the piezoelectric body where the first electrode is provided;

the piezoelectric body being supplied with an electric field through the first electrode and the second electrode so as to generate a resonant vibration, wherein a second mass load material portion having an annular shape is further provided so as to face the first mass load material portion outside the planar region of the second electrode on the main surface of the piezoelectric body on which the second electrode is provided, the first electrode and the first mass load material portion are electrically insulated from each other, at least one of the first mass load material portion and the second mass load material portion has a laminated structure including an auxiliary electrode and a load material layer formed on the auxiliary electrode, the auxiliary electrode being formed with the same material to have the same thickness as the first or the second electrode on the piezoelectric body, and a mass load effect obtained by summing the first mass load material portion and the second mass load material portion is greater than a mass load effect obtained by summing the first electrode and the second electrode.

12. The film bulk acoustic wave resonator according to claim 11, wherein the second electrode and the second mass load material portion are electrically insulated from each other.

13. The film bulk acoustic wave resonator according to claim 12, wherein the first electrode and the second mass load material portion are disposed such that they do not face each other, and the second electrode and the first mass load material portion are disposed such that they do not face each other.

14. A high frequency circuit component comprising a plurality of film bulk acoustic wave resonators, wherein at least one of the film bulk acoustic wave resonators is the film bulk acoustic wave resonator according to claim 11.

15. A communication device comprising an antenna, a transmitting circuit and a receiver circuit, wherein a connecting portion between the antenna and the transmitting circuit or the receiver circuit, or at least either one of the transmitting circuit and the receiver circuit comprises the high frequency circuit component according to claim 14.

16. A film bulk acoustic wave resonator comprising:

a piezoelectric body made of a piezoelectric thin film;

a first electrode provided on one main surface of the piezoelectric body;

a second electrode provided on the other main surface of the piezoelectric body; and a first mass load material portion having an annular shape provided outside the planar region of the first electrode on the main surface of the piezoelectric body on which the first electrode is provided, with a mass load effect of the first mass load material portion being larger than that of the first electrode, the piezoelectric body being supplied with an electric field through the first electrode and the second electrode so as to generate a resonant vibration, wherein the outer periphery of the planar region of the first electrode and the inner periphery of the annular first mass load material portion are spaced apart from each other, whereby the first electrode and the first mass load material portion are electrically insulated from each other, the first mass load material portion has a laminated structure including a first auxiliary electrode and a load material layer formed on the first auxiliary electrode, the first auxiliary electrode being formed with the same material to have the same thickness as the first electrode on the piezoelectric body, and a distance g between the outer periphery of the planar region of the first electrode and the inner periphery of the first mass load material portion is less than a single wavelength $\lambda h$ of vibrations in the plane direction in a region within the distance g.

17. The film bulk acoustic wave resonator according to claim 16, further comprising:

a substrate that supports a resonance portion configured by the piezoelectric body, the first electrode and the second electrode, wherein a cavity is formed in the substrate under the resonance portion.

18. The film bulk acoustic wave resonator according to claim 16, further comprising:

a substrate, and an acoustic mirror provided on the substrate and configured such that a low acoustic impedance layer and a high acoustic impedance layer are alternately disposed, wherein a resonance portion configured by the piezoelectric body, the first electrode and the second electrode is supported on the acoustic mirror.

19. The film bulk acoustic wave resonator according to claim 16, further comprising:

a leading wiring electrode connected to the first electrode, wherein the leading wiring electrode is electrically insulated from the first mass load material portion.

20. The film bulk acoustic wave resonator according to claim 19, wherein the leading wiring electrode is led through a cut-off portion formed in a part of the annular first mass load material portion, and the leading wiring electrode and the first mass load material portion are spaced apart from each other, whereby the leading wiring electrode and the first mass load material portion are electrically insulated from each other.

21. A high frequency circuit component comprising a plurality of film bulk acoustic wave resonators, wherein at least one of the film bulk acoustic wave resonators is the film bulk acoustic wave resonator according to claim 16.

22. A communication device comprising an antenna, a transmitting circuit and a receiver circuit, wherein a connecting portion between the antenna and the transmitting circuit or the receiver circuit, or at least either one of the transmitting circuit and the receiver circuit comprises the high frequency circuit component according to claim 21.

* * * * *